United States Patent
Schmidt

(10) Patent No.: US 8,373,414 B2
(45) Date of Patent: Feb. 12, 2013

(54) MAGNETIC RESONANCE SYSTEM AND METHOD FOR SPATIALLY RESOLVED DETECTION OF MOVEMENT PROCESSES

(75) Inventor: Sebastian Schmidt, Weisendorf (DE)

(73) Assignee: Siemens Aktiengesellschaft, Munich (DE)

( * ) Notice: Subject to any disclaimer, the term of this patent is extended or adjusted under 35 U.S.C. 154(b) by 404 days.

(21) Appl. No.: 12/718,295

(22) Filed: Mar. 5, 2010

(65) Prior Publication Data
US 2010/0225318 A1 Sep. 9, 2010

(30) Foreign Application Priority Data
Mar. 5, 2009 (DE) .......................... 10 2009 011 828

(51) Int. Cl.
*G01V 3/14* (2006.01)
*A61B 5/05* (2006.01)
(52) U.S. Cl. ........ 324/309; 324/306; 324/318; 600/419; 382/128
(58) Field of Classification Search .......... 324/300–322, 324/128–133; 382/128–133; 600/407–464
See application file for complete search history.

(56) References Cited

U.S. PATENT DOCUMENTS

| | | | | |
|---|---|---|---|---|
| 5,054,489 A | * | 10/1991 | Axel et al. ..................... | 600/419 |
| 6,438,404 B1 | * | 8/2002 | Van Den Brink et al. .... | 600/419 |
| 6,694,166 B2 | * | 2/2004 | Salome et al. ................ | 600/410 |
| 7,336,072 B2 | * | 2/2008 | Assmann et al. ............. | 324/306 |
| 7,609,868 B2 | | 10/2009 | Kuth et al. | |

OTHER PUBLICATIONS

"Heart Wall Motion: Improved Method of Spatial Modulation of Magnetization for MR Imaging," Axel, Cardiac Radiology, vol. 172 (1989) pp. 349-350.
"Three-Dimensional Myocardial Deformations: Calculation with Displacement Field Fitting to Tagged MR Images," O'Dell et al, Radiology, vol. 195, No. 3 (1995) pp. 829-835.
"Small Bowel Motility Assessment With Magnetic Resonance Imaging," Froehlich et al, Journal of Magnetic Resonance Imaging, vol. 21 (2005) pp. 370-375.

* cited by examiner

*Primary Examiner* — Melissa Koval
*Assistant Examiner* — Emily Chan
(74) *Attorney, Agent, or Firm* — Schiff Hardin LLP

(57) ABSTRACT

A method for spatially resolved detection and display of movement processes in an examination subject by means of magnetic resonance tomography includes the steps of imposing a magnetization pattern on at least a portion of a fluid medium located in the intestine of the examination subject, acquiring at least one image data set or a portion of an image data set that images the region of the examination subject on which the magnetization pattern was imposed, determining at least one item of movement information from the at least one image data set or portion of an image data set, by an analysis of the magnetization pattern in a processor, and presenting the at least one item of movement information through presentation device in communication with the processor.

11 Claims, 4 Drawing Sheets

MAGNETIC RESONANCE SYSTEM AND METHOD FOR SPATIALLY RESOLVED DETECTION OF MOVEMENT PROCESSES

BACKGROUND OF THE INVENTION

1. Field of the Invention

The invention concerns a method for spatially resolved detection and display of movement processes in an examination subject by means of magnetic resonance tomography.

2. Description of the Prior Art

The detection and display of movement processes by means of magnetic resonance tomography is fundamentally known. For example, methods are available in order to detect the flow speed of the blood at many points of the body. These methods are differentiated into two groups according to the manner of the generation of the movement information. The first group deals with what are known as phase contrast (PC) methods, wherein movement information is imposed on the examination subject in the examination region via bipolar gradients. A flow speed can then be obtained via acquisition of multiple movement-coded image data sets and phase response or signal intensity curve determined from said image data sets.

"Time of flight" (TOF) methods are known as a second group. In these methods the magnetization is prepared at a point of the examination subject (for example by signal saturation) and read out at the same point or another point. A certain wait time passes between the preparation and the readout, based on which flow information can be achieved under consideration of the signal intensity of the image and possibly a difference calculation relative to a reference image.

It is known that phase contrast methods offer a better speed resolution, which is why these are preferably used for flow measurement.

A common factor in all conventional methods is that only one spatial direction can be flow-coded by such methods. The known methods also universally assume a laminar (thus uniform) flow.

Multiple methods are available to detect intestinal activity. For example, the position of a capsule in the intestine can be determined by means of capsule endoscopy, and the movement of the capsule (and thus of the intestine contents) can thus be indirectly inferred. Alternatively, the passage time of a substance through the intestine can be determined, with which an average speed can be established. Furthermore, it is known to repeatedly image the intestine diameter along the central axis of the intestine by means of magnetic resonance tomography in order to determine from this the intestinal peristalsis. To detect the intestine diameter it is therefore necessary to select the image orientation perpendicular to the central axis of the intestine. Since the intestine is known to run in multiple convolutions, only the acquisition of a small segment of the intestine is ever possible. These requirements also apply to the cited flow quantification method.

SUMMARY OF THE INVENTION

An object of the present invention is to provide a method of the aforementioned type that enables a simple and automatable detection of the intestine content in a size range of the of the intestine of an examination subject.

This object is achieved in accordance with the invention by a method that includes the steps of imposing a magnetization pattern on at least a portion of a fluid medium located in the intestine of the examination subject, acquiring at least one image data set or a portion of an image data set that images the region of the examination subject on which the magnetization pattern was imposed, determining at least one item of movement information from the at least one image data set or portion of an image data set, by an analysis of the magnetization pattern in a processor, and presenting the at least one item of movement information though a presentation device in communication with the processor.

With the method according to the invention it is possible to detect and display the movement processes of the intestine contents of both a portion of the intestine and the entire intestine. Moreover, the evaluation of the magnetization pattern allows an automated evaluation of the movement information since the magnetization pattern appears via signal intensity differences in the image data set or image data sets. Signal intensities can easily be supplied to an automated additional processing by setting a threshold or difference calculation between two image data sets. The determination of the movement information naturally ensues with computer assistance and can thus be conducted automatically. A control device required for this is present at every magnetic resonance tomograph.

The presentation of the at least one item of movement information can be conducted at a display device directly after the acquisition and processing of the at least one image data set or, respectively, portion of an image data set. Alternatively, the movement information can be visualized with arbitrary time interval after the data acquisition, for example by printout on paper.

The fluid medium located in the intestine exhibits a certain viscosity. This means such that the medium exhibits a certain stability and no turbulence arises in the medium due to the intestinal peristalsis, for example. The term "fluid" here merely express that the medium is not a solid. For example, a thickening agent such as agarose, starch compounds, gelatins or equivalent substances can be added to water in order to achieve the desired viscosity. The patient must then accordingly ingest this medium before the data acquisition so that the medium is located in the intestine, or in a portion of the intestine.

The magnetization pattern is achieved by a targeted influencing of the saturation state of the spins of specific regions of the examination subject. For this purpose, at least one sequence (composed of multiple pulses that form a binomial pulse) and at least one magnetic field gradient can be used to apply the magnetization pattern. Binomial pulses are a sequence of pulses whose length or attenuation properties are formed corresponding to a sequence of binomial coefficients. Such sequences are formed in the following according to Pascal's triangle. Possible sequences are 1-1, 1-2-1, 1-3-3-1 etc. for example, three pulses with the same profile (for example hard pulses or Gauss pulses or also sin c pulses) are used whose length was mapped in the ratio 1:2:1. If the first pulse has a length of 1 ms, for example, the second pulse at the same attenuation has a length of 2 ms and the third pulse in turn has a length of 1 ms. Instead of the pulse length, the attenuation of the pulse can also be varied such that the energy introduced by the middle pulse is twice as large as that of the first and the last pulse.

The total excitation angle of a binomial pulse is 90°, whereby multiple slices are generated as an magnetization pattern, wherein slices with saturated and unsaturated spins alternate with one another.

Two sequences can be particularly advantageously used when the generated magnetization patterns are essentially arranged orthogonal to one another so that the magnetization pattern has the form of a grid. In magnetic resonance scanners, three magnetic field gradients orthogonal to one another can be generated, with nomenclature applied thereto according to the usage purpose as slice gradient, phase coding gradient and readout gradient. The gradient fields can also be arbitrarily combined with one another, however, so that an effective gradient can be produced in every spatial direction. If the magnetization patterns should be orthogonal to one another, the gradient fields respectively activated during the radiation of the binomial pulses must likewise be orthogonal to one another. A grid that contains saturated spins that only provide for the generation of a measurement signal again after a relaxation of the longitudinal magnetization is thereby imposed upon the examination region. The time span of 1-2 seconds after imposition of the magnetization pattern is available for the implementation of experiments, wherein the saturation of the spins in the imaging is still noticeable as slight signal intensities in the corresponding image regions. Given an image acquisition approximately 5 seconds after imposition of the magnetization pattern, the saturation of the spins is no longer detectable in practice. The described time spans depend on the T1 relaxation time. This is longest for free water; the time available for imaging can also be shortened given addition of contrast agents or thickening agents.

In order to obtain movement information from the magnetization pattern imposed in the image data set or the image data sets, this information must be placed in some sort of context. In a first alternative, to determine the movement information at least one item of information determined from two image data sets or portions of image data sets acquired after imposing the magnetization pattern can be used. Ultimately this means to acquire two image data sets after the magnetization preparation and to form a difference image data set from these. Insofar as no additional movements are present, a difference results in the image data sets merely due to the movement of the fluid medium, so the magnetization pattern is also moved. While the difference image data set merely shows a noise signal at the points without movement, a signal intensity fluctuation can be established at the points of the moved magnetization pattern. Since a path information is present via the known spatial resolution of the individual image data sets, and the time interval of the acquisition of the image data sets is also known, and the time information likewise exists, velocity information can be derived from these items of information.

Because an unlimited time period is not available for the acquisition of one or more image data sets (as stated above), it is naturally possible to acquire only portions of image data sets instead of complete image data sets and to supplement and reconstruct these with known methods. A "complete image data set" is an image data set whose data (k-space lines) are such that the set can be Fourier-transformed and evaluated without significant post-processing methods. Lesser post-processing steps such as baseline correction or zero filling may still be implemented "supplementation of data" means the subsequent calculation or supplementation of actual raw data (acquired data). For example, reference image data sets can be acquired before the actual measurement of the image data sets containing the movement information. The image data set embodying the movement information can then be supplemented from these reference image data sets, by known methods such as keyhole imaging or GRAPPA. This enables a significantly faster acquisition of the movement information than would be possible given an acquisition of complete image data sets.

As a second alternative, the spatial arrangement of the magnetization pattern may be additionally taken into account to determine the movement information. The magnetization pattern is known and can be calculated in terms of its shape. The parameters used at the magnetic resonance tomograph thus allow a calculation of the signal intensity distribution without a measurement being necessary for this. An image data set representing the magnetization pattern can be calculated from this knowledge without having to measure said magnetization pattern. As a result, the acquisition of a single image data set is then sufficient; a difference image data set can be determined from a measured image data set and a calculated image data set. Moreover, such a theoretical image data set does not have to be calculated in the first place; the position of a saturated slice as such can also be known. For simpler calculation, the center line (that is shown in the image merely as a stripe or, respectively, as a flat surface) is calculated from this slice. This theoretical center line can be specified for every saturated slice, so a grid composed of center lines is created. This can be compared with center lines calculated from the image data set. As in the case of the difference image data set, velocity information can be determined from this based on the path information and the time information.

In principle, the use of two orthogonal magnetization patterns is not necessary as long as the magnetization pattern is imposed perpendicular to the movement direction. However, this requires a precise setting of the image plane even given laminar flow in perfect hollow cylinders (thus under ideal conditions). In this case of the intestine, this cannot be achieved in practice. Coding of the velocity information in two spatial directions is achieved by imposing the magnetization pattern, which is again sufficient in the present case. The node points formed by the grid that is then created are of particular interest for the movement information since they simultaneously provide information in the coded spatial directions. The displacement of node points corresponding to one another in the at least two image data sets or portions of image data sets, or in one image data set or a portion of an image data set and the known spatial arrangement of the magnetization pattern, can be particularly advantageously used to determine the movement information. The observation of only individual pixels (image points) or node points also allows a minimization of the computation cost.

Naturally, the imposition of the magnetization pattern and the subsequent acquisition of image data sets occur not just once but over a longer time period, for example multiple minutes or even an hour or longer. In the presentation of the data, it must be established as to how these items of movement information should be displayed (presented). Various embodiments are conceivable for this. The respective magnitudes of the vectors representing a determined displacement from multiple image data sets can be added. Alternatively, the vectors (i.e., magnitude and direction) representing a determined displacement can be added from multiple image data sets. The movement information determined from the image data set or image data sets ultimately exists as a movement vector relative to the respective node point. If a movement can now take place in two directions (forward and backward, so to speak), it is necessary to add the vectors in terms of absolute value. This total vector then no longer represents a total movement; rather, it is a measurement of the activity relative to the respective node point. If the total vector should represent the total movement, the respective vectors are simply added without calculating the absolute values.

If the movement information contained in the image data is not aggregated in such a manner, the determined displacements can be depicted with temporal offset corresponding to the order of the respective acquisition point in time of the image data set. In other words, the movement information or the items of movement information contained in the image data sets can also represent a movie (cine presentation).

A vector as such is merely an accumulation of numerical values. Possibilities to show information pertaining to a vector are described below.

For example, to present the movement information the total vector that is determined from a vector or a summation of vectors of the displacement of a node point can be associated with the corresponding node point and shown superimposed on an image data set. The direction of the vector thereby indicates the direction of the total movement; the length of the vector is a measurement of the magnitude or the absolute value of the total vector. Since the movement vectors are respectively calculated for node points, it is illustrative to show the respective vector or total vector overlaid on the node point.

Alternatively, to present the movement information the absolute value of the direction of the total vector (that is determined from a vector or a summation of vectors of the displacement of a node point) can be shown with color coding. The possibility of color coding is alternatively or additionally to overlay at the corresponding node point. A vector shown overlaid on a node point can thus also be shown with color coding, which is in particular advantageous when a plurality of vectors is shown overlaid in an image data set. If only a few vectors are overlaid on an image data set, an additional color coding could more likely lead to confusion of the observer.

For color coding, the color can be determined depending on the direction of the total vector and the transparency can be determined depending on the magnitude of the total vector. The total vector can be added from the individual vectors in terms of absolute value or as in the present example; however, the magnitude of the total vector is used to determine the transparency.

Alternatively, the color can be selected depending on the direction relative to a surface normal of the intestine segment. This type of presentation immediately shows the observer whether the intestine contents move more "forward" or more "backward" in the appertaining region. Naturally, the transparency here can also be shown depending on the magnitude of the total vector. In this depiction, the movement information is shown in two colors, whereby the conclusion of the presentation is made very easily accessible to the observer. The surface normal of the intestine segment indicates the primary axis of the intestine in the appertaining segment. As described above, the intestine is a looping and convoluted object, which is why it generally does not have a primary axis. In an exemplary approximation, however, the intestine can be imagined as a combination of hollow cylinders of different alignment. Each of these hollow cylinders or intestine segments possesses a central axis. This is the surface normal of this intestine segment and provides the primary movement direction in this segment.

The above object also is achieved in accordance with the present invention by a magnetic resonance tomography apparatus that is operable to implement the method described above, as well as all embodiments thereof.

DESCRIPTION OF THE PREFERRED EMBODIMENTS

Figure 1:
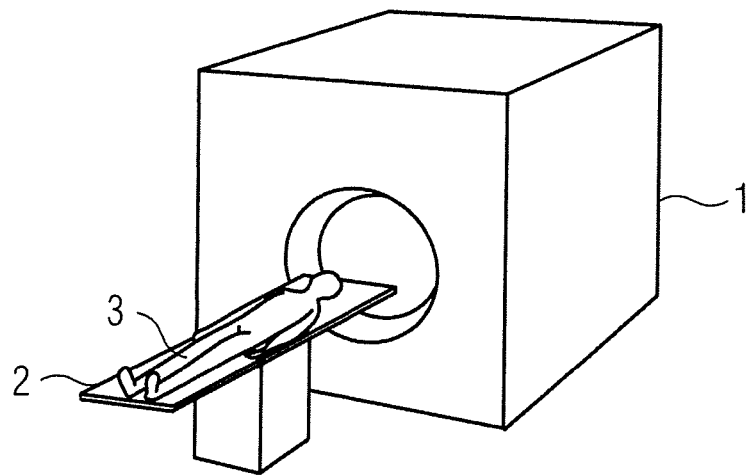
FIG. 1 schematically shows a magnetic resonance tomography scanner.

FIG. 1 shows a magnetic resonance tomography scanner 1 with a patient bed 2 and a patient 3 supported thereon. The patient bed can be driven into the opening of the scanner 1 in order to acquire image data of the patient 3. Further typical devices sufficiently known to those skilled in the art—for example a possible EKG device to detect the electrocardiogram of the patient 3, the control device of the magnetic resonance tomograph 1 and further typical elements (for example magnetic field gradients)—are not explained in detail at this point since they are sufficiently known to those skilled in the art.

Figure 2:
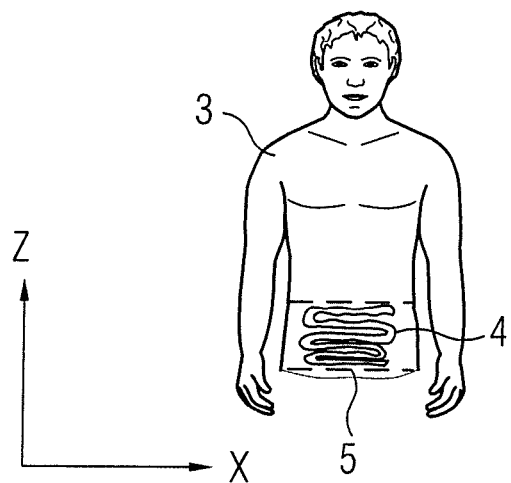
FIG. 2 shows a region of a patient that is to be imaged.

FIG. 2 shows the patient 3 as well as the intestine 4 of the patient that determines the region 5 to be imaged. For spatial orientation, coordinate axes are added in FIG. 2 and some of the following Figures. Identical designations (x, y, z) indicate identical axial directions.

Figure 3:
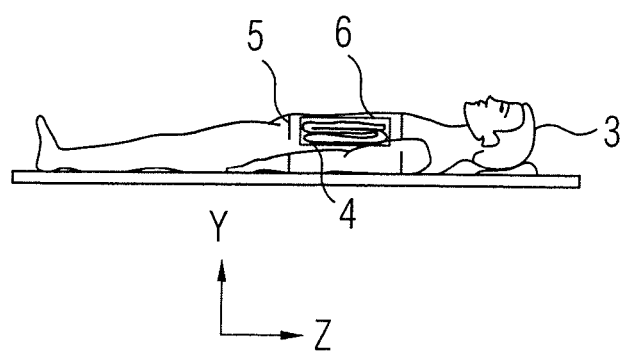
FIG. 3 shows the positioning of an image data set on a patient.

FIG. 3 shows the patient 3 in a cross section view. The image data set 6 to be acquired with the magnetic resonance tomograph 1 exhibits such a slice thickness that the intestine lies with its entire circumference within the slice of the image data set 6. An item of velocity information cannot be obtained in the direction designated with y.

Figure 4:
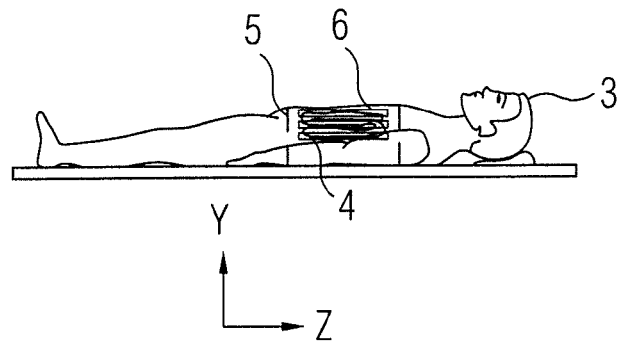
FIG. 4 shows the positioning of multiple image data sets on a patient.

An alternative embodiment is shown in FIG. 4. Multiple image data sets 6 of the intestine 4 of the patient 3 are acquired. The image data sets 6 essentially encompass the intestine 4.

Figure 5:
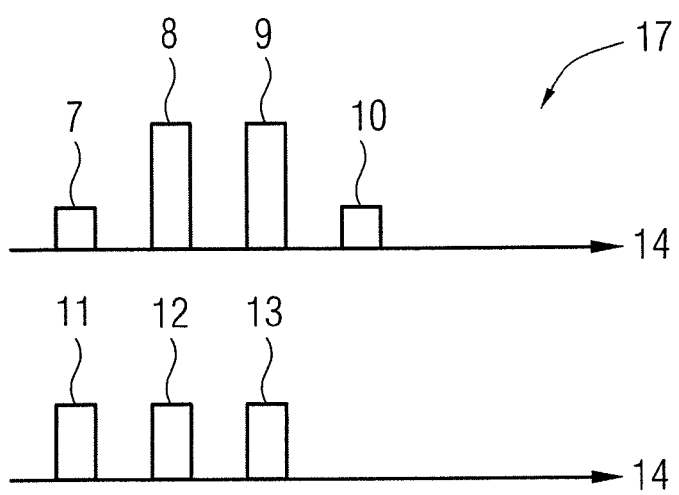
FIG. 5 illustrates a binomial pulse.

FIG. 5 shows a possible arrangement of radio-frequency pulses 7, 8, 9 and 10 as well as magnetic field gradients 11, 12 and 13 for generation of what is known as a binomial pulse 17. The attenuation of the radio-frequency pulses 8 and 9 is selected such that they flip the magnetization out of the rest position or, respectively, real position by three times the angle in comparison to the radio-frequency pulses 7 and 10, wherein the radio-frequency pulses 7, 8, 9 and 10 overall produce a flip angle of 90°. The high magnetic field gradients 11, 12 and 13 must be applied in the same spatial direction but are not limited to one specific alignment (for example in the x-direction). The axis 14 respectively indicates a measurement of the time; therefore the temporal workflow of the switching of the radio-frequency pulses and the magnetic field gradients can be learned from FIG. 5.

Figure 6:
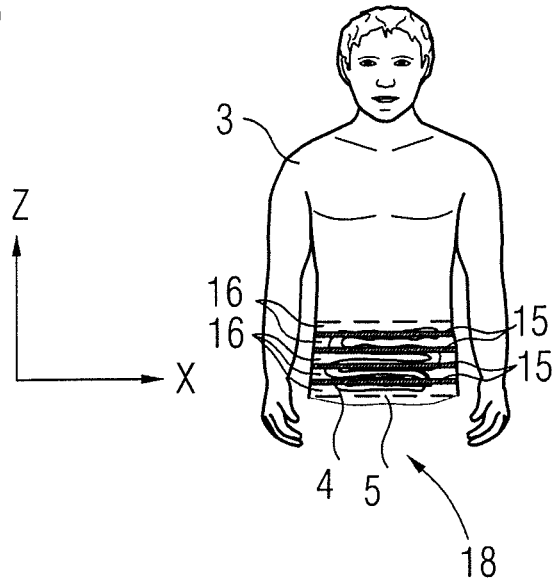
FIG. 6 shows a magnetization pattern generated by a binomial pulse.
Figure 7:
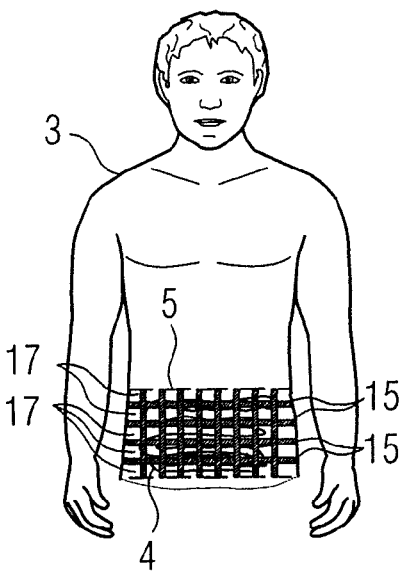
FIG. 7 shows a magnetization pattern generated by two binomial pulses.

Given suitable selection of the radio-frequency pulses 7-10 and magnetic field gradients 11-13 in the patient, the use of the binomial pulse 17 according to FIG. 6 generates a magnetization pattern consisting of slices with saturated spins 15 and slices with unsaturated spins 16. Given an image data acquisition following the binomial pulse 17, the slices 15 provide no signal while the slices 16 generate a detectable signal. If two binomial pulses 17 in direct succession are used, wherein the magnetic field gradients of the second binomial pulse 17 must be switched orthogonal to the those of the first, a magnetization pattern in the form of a grid made up of saturated slices 15 can be generated. This is shown in FIG. 7. The unsaturated regions 17 now exist as cuboids.

After preparation of the region 5 to be acquired with the magnetization pattern 18, this must be detected via one or more image data sets. The radio-frequency pulses 7-10 of the binomial pulse 17 serve merely for the saturation of the magnetization and accordingly cannot be used here as excitation pulses. Since no laminar flow is present in the intestine, if possible complete image data sets should be generated after the preparation of the magnetization. Snapshots of the movement can thus be created without introducing artifacts into the image. The unsaturated magnetization can be read out by means of a FLASH sequence. For additional acceleration, only the central k-space lines can be read out while the outer k-space lines of the image data set are taken from a reference data set without magnetization preparation. This method is known as keyhole imaging. Alternatively methods for parallel imaging, for example GRAPPA, are likewise known.

Figure 8:
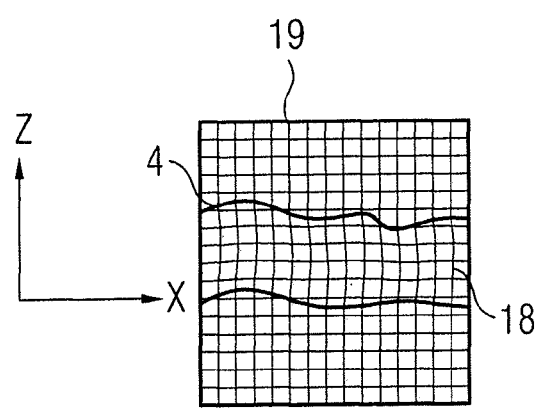
FIG. 8 shows an image data set.
Figure 9:
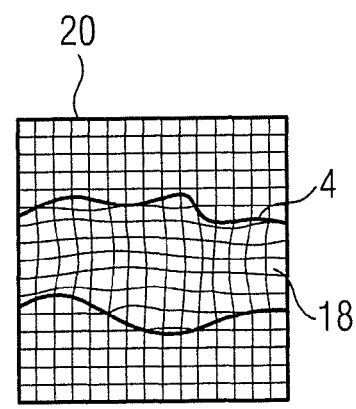
FIG. 9 shows an image data set in a second embodiment.
Figure 10:
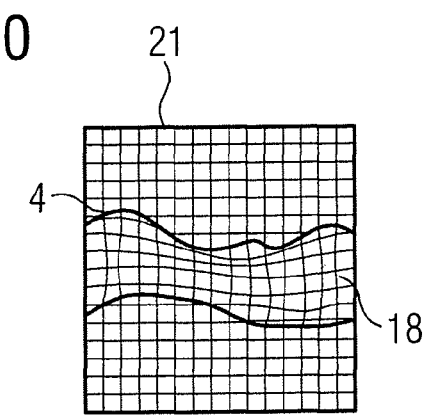
FIG. 10 shows an image data set in a third embodiment.

FIGS. 8 through 10 show examples of a segment of the intestine 4. The image data set 19 was acquired directly after the magnetization preparation, after which the image data set 20 and subsequently the image data set 21 were acquired. The magnetization pattern 18 is thereby moved by the movement of the medium in the intestine 4; see FIGS. 8 through 10. In order to be able to detect the movement of the medium in as simple a manner as possible, the movement of grid points of the magnetization pattern 18 that correspond to one another is tracked. For this the theoretical magnetization pattern 18 during the preparation is calculated back from the depiction of the movement that occurred after the magnetization preparation, which is already visible in image data set 9. Movement information can thus already be developed from the image data set 19.

Figure 11:
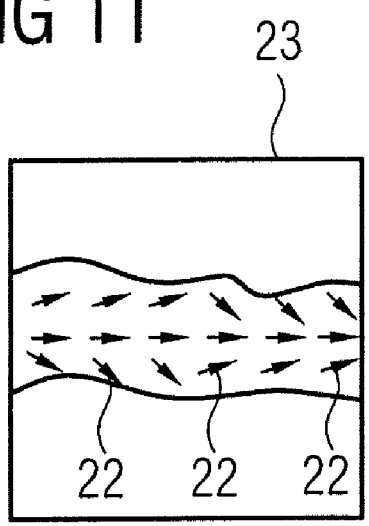
FIG. 11 shows a difference image data set.

This movement information is shown as movement vector 22. A movement vector can be determined regarding each node point. These movement vectors 22 can, for example, be shown superimposed on the respective positions of the node points in an overview image, i.e. an image without magnetization pattern 18. A difference image for calculation of the movement vectors 22 is generated to determine the movement vectors 22 in FIG. 11. The movement vectors 22 determined from this difference image can in turn be superimposed on the reference image data set 23.

Figure 12:
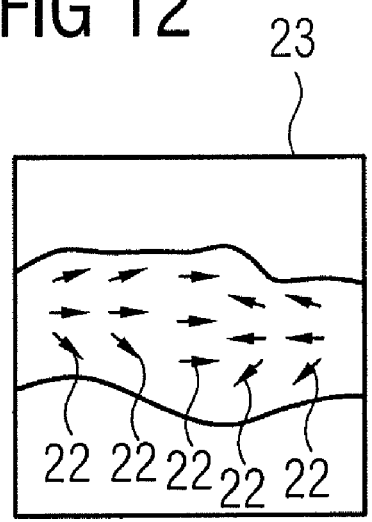
FIG. 12 shows a difference image data set in a second embodiment.

Just such a difference image data set can also be obtained from the image data sets 20 and 21, as shown in FIG. 12. By repeatedly imposing the magnetization pattern 18 and subsequently acquiring data, three image data sets can respectively be acquired with small time intervals. A plurality of movement vectors can thus be calculated over a time period of multiple minutes.

Figure 13:
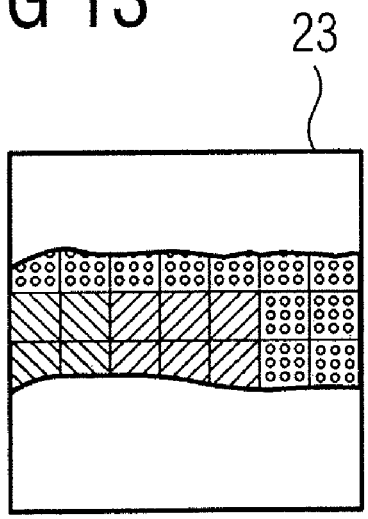
FIG. 13 shows an image data set in a fourth embodiment.

FIG. 13 shows a possibility to present this information in a concentrated form. Here the magnitude of all vectors is calculated and added to the magnitude belonging to a node point. Activity information is hereby created in the first place for the corresponding node; however, a region depending on the size of the imposed grid is always shown in color immediately around the node point. The color is thereby used as a measure of the absolute value of the vector; slower velocities are shown color coded in light colors, starting from white for a velocity of 0 up to blue for the highest detected velocity or the highest calculated magnitude. Regions of higher activity and lower activity can thereby be differentiated. FIG. 13 or the image data set 23 in fact depicts only a portion of the intestine; this representation is naturally possible for the entire intestine or examination region.

Figure 14:
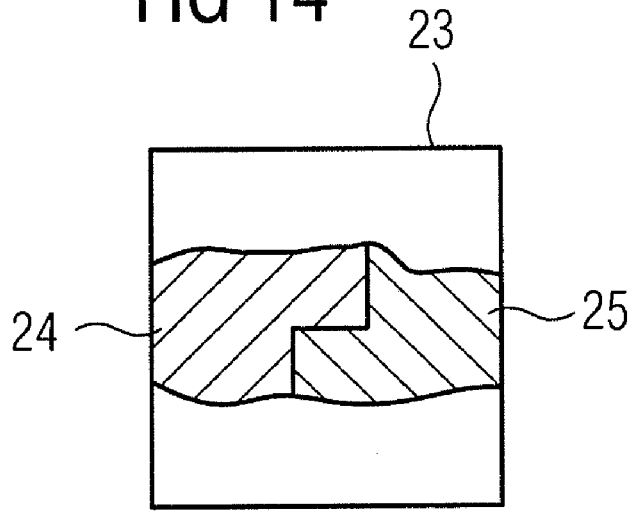
FIG. 14 shows an image data set in a fifth embodiment.

For a simple calculation of a movement in the direction of the surface normal of the intestine, it is assumed that the primary axes of the intestine respectively run essentially in the direction of the x-direction or the z-direction. The portion in the x-direction from all determined movement vectors can then be added with regard to the respective node point without calculating the magnitude; regions around node points whose movement vector has a value less than 0 are inked in a first color (such as red) while all other regions are colored another color (such as in blue). For example (see FIG. 14) a region 24 is obtained in which the total movement in the direction is less than 0 (thus travels to the left) while the total movement in region 25 is greater than 0; the movement in the x-direction thus runs in total to the right.

A total movement for the z-direction can be calculated and depicted in the same way. This presentation enables it to be immediately established in a simple manner whether there are opposite movements in specific regions, and whether the peristalsis of the intestine 4 moves the contents in the correct direction.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance method for spatially resolved detection and display of movement processes in an examination subject, comprising the steps of:
    placing an examination subject in a magnetic resonance data acquisition unit and, with said data acquisition unit, imposing a magnetization pattern on at least a portion of a fluid medium, comprising intestinal contents subject to intestinal peristalsis, located in the intestine of the examination subject by executing two magnetic resonance data acquisition sequences in said data acquisition unit that respectively produce individual magnetization patterns that are orthogonal to each other, said magnetization pattern being formed as a grid of said individual magnetization patterns, said grid comprising a plurality of node points;
    with the data acquisition unit, acquiring an acquired image data set from a region of the examination subject on which said magnetization pattern was imposed, selected from the group consisting of a complete image data set that images said region, and a portion of a complete image data set that images said region;
    supplying said acquired image data set to a processor and, in said processor, automatically analyzing said magnetization pattern to determine at least one item of movement information from said acquired image data set by analyzing a spatial arrangement of said magnetization pattern and by identifying a displacement between respective node points corresponding to each other in said acquired image data sets, and analyzing said displacement together with said spatial arrangement to determine said item of movement information; and
    from said processor visually presenting said at least one item of movement information in a humanly perceptible form.

2. A method as claimed in claim 1 comprising imposing said magnetization pattern by generating a sequence, in said data acquisition unit, comprising a plurality of pulses that form a binomial excitation pulse and at least one magnetic field gradient.

3. A method as claimed in claim 2 comprising imposing said magnetization pattern by exciting nuclear spins in multiple slices of the examination subject with saturated and unsaturated spins alternating with each other.

4. A method as claimed in claim 1 comprising representing said displacement as a vector and determining a total displacement as a sum of respective magnitudes of vectors from multiple acquired image data sets.

5. A method as claimed in claim 1 comprising representing said displacement as a vector and determining a total displacement as a sum of vectors from multiple acquired image data sets.

6. A method as claimed in claim 1 comprising presenting the determined displacement with a temporal offset corresponding to a sequence of respective points in time of acquisitions of the respective acquired image data sets.

7. A method as claimed in claim 1 comprising overlaying a total vector representing a sum of vectors of the displacement of said node point for multiple acquired image data sets, on a magnetic resonance image generated from the acquired image data set.

8. A method as claimed in claim 1 comprising determining a magnitude of said total vector and color coding said magnitude in a visual display to depict said item of movement information.

9. A method as claimed in claim 8 comprising selecting said color dependent on a direction of said vector and determining a transparency of the color depending on the magnitude of said total vector.

10. A method as claimed in claim 8 comprising selecting said color dependent on a direction of said vector relative to a surface normal of a segment of the intestine of the examination subject.

11. A magnetic resonance tomography apparatus for spatially resolved detection and display of movement processes in an examination subject, comprising:

a magnetic resonance data acquisition unit configured to receive an examination subject therein;

a control unit configured to operate said data acquisition unit to impose a magnetization pattern on at least a portion of a fluid medium, comprising intestinal contents subject to intestinal peristalsis, located in the intestine of the examination subject by executing two magnetic resonance data acquisition sequences in said data acquisition unit that respectively produce individual magnetization patterns that are orthogonal to each other, said magnetization pattern being formed as a grid of said individual magnetization patterns, said grid comprising a plurality of node points;

said control unit being configured to operate said data acquisition unit to acquire an acquired image data set from a region of the examination subject on which said magnetization pattern was imposed, selected from the group consisting of a complete image data set that images said region, and a portion of a complete image data set that images said region;

a processor supplied with said acquired image data set, said processor being configured to automatically analyze said magnetization pattern to determine at least one item of movement information from said acquired image data set by analyzing a spatial arrangement of said magnetization pattern and by identifying a displacement between respective node points corresponding to each other in said acquired image data sets, and analyzing said displacement together with said spatial arrangement to determine said item of movement information; and said processor emitting an output from which said at least one item of movement information is presentable in a humanly perceptible form.

\* \* \* \* \*